(12) United States Patent
Komatsu et al.

(10) Patent No.: US 12,087,701 B2
(45) Date of Patent: Sep. 10, 2024

(54) PACKAGE MODULE COMPRISING SHIELD FILM ON SEMICONDUCTOR DEVICE AND METHOD OF MANUFACTURING THE SAME

(71) Applicant: Murata Manufacturing Co., Ltd., Nagaokakyo (JP)

(72) Inventors: Toru Komatsu, Nagaokakyo (JP); Tadashi Nomura, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 391 days.

(21) Appl. No.: 17/497,177

(22) Filed: Oct. 8, 2021

(65) Prior Publication Data
US 2022/0045013 A1  Feb. 10, 2022

Related U.S. Application Data

(63) Continuation of application No. PCT/JP2020/017146, filed on Apr. 21, 2020.

(30) Foreign Application Priority Data

Apr. 26, 2019 (JP) .................................. 2019-086252

(51) Int. Cl.
*H01L 23/552* (2006.01)
*H01L 21/56* (2006.01)
(Continued)

(52) U.S. Cl.
CPC .......... *H01L 23/544* (2013.01); *H01L 21/561* (2013.01); *H01L 23/552* (2013.01); *H01L 25/16* (2013.01); *H01L 2223/54433* (2013.01)

(58) Field of Classification Search
CPC ... H01L 23/552; H01L 21/561; H01L 23/544; H01L 25/16
(Continued)

(56) References Cited

U.S. PATENT DOCUMENTS

2011/0006106 A1* 1/2011 Kanryo ................. H01L 25/165
228/170
2011/0198115 A1   8/2011 Azuma et al.
(Continued)

FOREIGN PATENT DOCUMENTS

| JP | 2011233648 A | 11/2011 |
| JP | 2012243895 A | 12/2012 |
| JP | 2014209544 A | 11/2014 |

OTHER PUBLICATIONS

Written Opinion of the International Searching Authority issued for PCT/JP2020/017146, date of mailing Jun. 23, 2020.
(Continued)

*Primary Examiner* — Didarul A Mazumder
(74) *Attorney, Agent, or Firm* — ArentFox Schiff LLP (57) ABSTRACT

A module is provided that includes a substrate having a first main surface, a first component mounted on the first main surface, a first sealing resin disposed so as to cover the first main surface and the first component, and a shield film covering at least an upper surface of the first sealing resin. The shield film includes a conductive layer, a first protective layer covering the conductive layer, and a second protective layer. The first protective layer is locally formed with a marking section. The second protective layer includes a first region covering the first protective layer and a second region covering the marking section.

20 Claims, 10 Drawing Sheets

(51) Int. Cl.
*H01L 23/544* (2006.01)
*H01L 25/16* (2023.01)

(58) Field of Classification Search
USPC .......................................................... 257/659
See application file for complete search history.

(56) References Cited

U.S. PATENT DOCUMENTS

| | | |
|---|---|---|
| 2012/0295668 A1 | 11/2012 | Kitahara et al. |
| 2014/0204550 A1 | 7/2014 | Katoaka et al. |
| 2014/0284775 A1* | 9/2014 | Nomura .................. H01L 24/85 |
| | | 257/659 |
| 2017/0358540 A1* | 12/2017 | Min ...................... H01L 23/295 |
| 2018/0108618 A1* | 4/2018 | Yamamoto .............. C23C 14/14 |

OTHER PUBLICATIONS

Written Opinion of the International Searching Authority issued for PCT/JP2020/017145, date of mailing Jun. 23, 2020.
International Search Report issued for PCT/JP2020/017146, date of mailing Jun. 23, 2020.
International Search Report issued for PCT/JP2020/017145, date of mailing Jun. 23, 2020.

\* cited by examiner

PACKAGE MODULE COMPRISING SHIELD FILM ON SEMICONDUCTOR DEVICE AND METHOD OF MANUFACTURING THE SAME

CROSS REFERENCE TO RELATED APPLICATIONS

The present application is a continuation of PCT/JP2020/017146 filed Apr. 21, 2020, which claims priority to Japanese Patent Application No. 2019-086252, filed Apr. 26, 2019, the entire contents of each of which are incorporated herein by reference.

TECHNICAL FIELD

The present invention relates to a module and a method of manufacturing the same.

BACKGROUND

Japanese Patent Laid-Open No. 2012-243895 (hereinafter "PTL 1") describes a power amplification module. The power amplification module described in PTL 1 includes a wiring board which is formed with a multilayer wiring layer therein, and a semiconductor chip and a passive component which are mounted on the wiring board. A sealing body is formed on the wiring board so as to cover the semiconductor chip, the wire, and the passive component. A plurality of recesses are formed on the surface of the sealing body as a product identification mark and a peeling prevention mark. The surface of the sealing body on which the product identifying mark and the peeling prevention mark are formed is covered with a shield film.

In PTL 1, after the sealing body is formed, the product identification mark and the peeling prevention mark are formed on the surface of the sealing body by irradiating the surface of the sealing body with a laser beam.

In order to make the product identification mark visible, the recess which is formed as the product identification mark must be processed to a certain depth. To this end, a resin layer which is formed as the sealing body must have a thickness sufficiently larger than the depth of the recess to be formed by laser irradiation. Otherwise, the laser irradiation performed on the sealing body may damage the wiring substrate or components mounted on the wiring substrate.

When the thickness of the sealing body is not sufficient, it is necessary to print the product identification mark by laser irradiation while avoiding the components mounted on the wiring substrate. In other words, a mark may not be printed at a position where a component is mounted. When a mark is printed under such a restriction, information that may be printed in the mark and the size thereof are limited.

SUMMARY OF THE INVENTION

Therefore, it is an object of the present invention to provide a module constructed for preventing a component mounted thereon from being affected by the printing of a mark and preventing the layout of the mark from being restricted by the arrangement of the component mounted thereon. Moreover, a method of manufacturing such a module is also disclosed herein.

Accordingly, a module according to an exemplary embodiment is provided that includes a substrate having a first main surface, a first component mounted on the first main surface, a first sealing resin disposed so as to cover the first main surface and the first component, and a shield film covering at least an upper surface of the first sealing resin. Moreover, the shield film includes a conductive layer, a first protective layer covering the conductive layer, and a second protective layer. The first protective layer is locally formed with a marking section, and the second protective layer includes a first region covering the first protective layer and a second region covering the marking section.

According to the exemplary embodiment of the present invention, since the marking section may be formed without removing the first sealing resin, the component sealed by the first sealing resin is not affected. In other words, according to the exemplary embodiment, the module is constructed to prevent a component mounted thereon from being affected by the printing of a mark and to prevent the layout of the mark from being restricted by the arrangement of the component mounted thereon.

DETAILED DESCRIPTION OF EMBODIMENTS

In general, it is noted that components in the drawings may not be drawn to scale, and may be exaggerated for the convenience of explanation. In the following description, when an upper position or a lower position is mentioned, it does not necessarily mean an absolutely upper or lower position, and it may mean a relatively upper or lower position in the illustrated pose.

First Exemplary Embodiment

Figure 1:
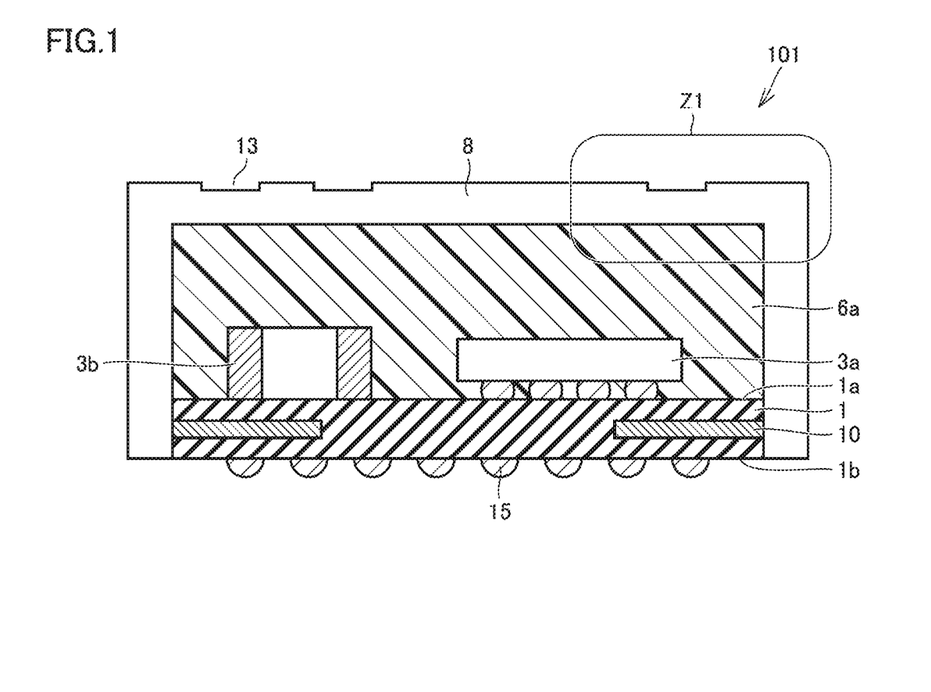
FIG. 1 is a cross-sectional view illustrating a module according to a first exemplary embodiment.
Figure 2:
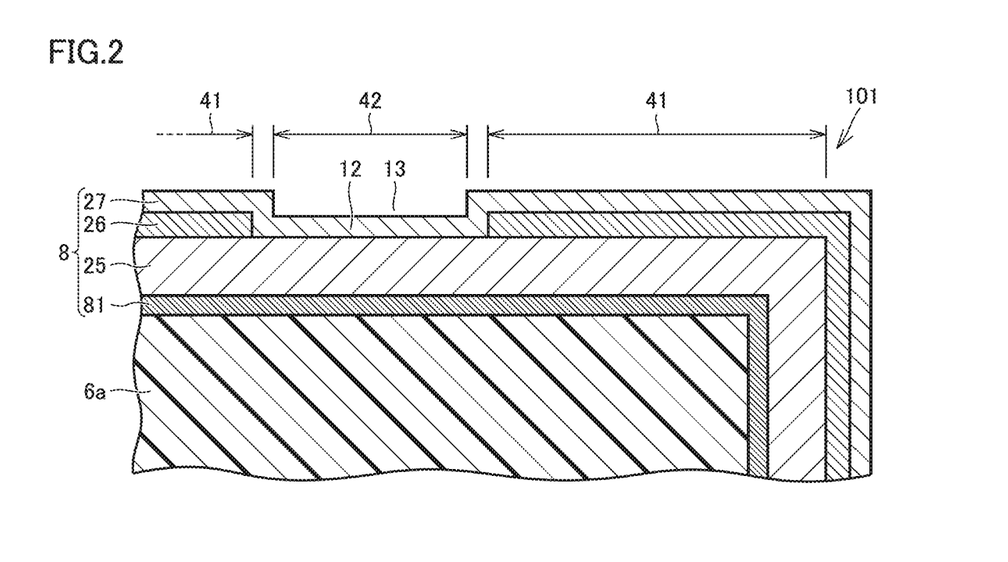
FIG. 2 is an enlarged view illustrating a portion Z1 in FIG. 1.

A module according to a first exemplary embodiment will be described with reference to FIGS. 1 and 2. FIG. 1 is a cross-sectional view illustrating a module 101 according to the present embodiment. FIG. 2 is an enlarged view illustrating a portion Z1 in FIG. 1.

As shown, the module 101 includes a substrate 1 having a first main surface 1a, a first component 3a mounted on the first main surface 1a, a first sealing resin 6a disposed so as to cover the first main surface 1a and the first component 3a, and a shield film 8 covering at least the upper surface of the first sealing resin 6a. As shown in FIG. 2, the shield film 8 includes a conductive layer 25, a first protective layer 26 covering the conductive layer 25, and a second protective layer 27. The first protective layer 26 is locally formed with a marking section 12. The second protective layer 27 includes a first region 41 covering the first protective layer 26 and a second region 42 covering the marking section 12. Preferably, the upper surface of the second region 42 is lower than the upper surface of the first region 41, relative to the thickness (e.g., vertical) direction of the module 101.

In the present embodiment, the marking section 12 is formed as a region from which the first protective layer 26 is locally removed, and the upper surface of the shield film 8 is formed with a recess 13 corresponding to the marking section 12.

In the example illustrated in the drawings, the first protective layer 26 is locally removed so as to expose the conductive layer 25 in the marking section 12. As also shown, the second protective layer 27 covers the conductive layer 25 exposed in the second region 42.

In the exemplary aspect, the substrate 1 is a wiring substrate. A GND electrode 10 is formed by a conductor pattern inside the substrate 1. The GND electrode 10 is exposed from a side surface of the substrate 1. In addition to the first component 3a, a component 3b is mounted on the first main surface 1a of the substrate 1. The first component 3a may be, for example, an integrated circuit (IC). The component 3b may be, for example, an inductor, a capacitor or the like. The first sealing resin 6a is formed so as to cover all the components mounted on the first main surface 1a.

Moreover, the substrate 1 has a second main surface 1b opposite to the first main surface 1a. The second main surface 1b is provided with external terminals 15. The external terminals 15 are solder balls, for example.

The conductive layer 25 is preferably formed of a material having high conductivity, which can be copper (Cu), for example. Preferably, the first protective layer and the second protective layer are both rustproof layers. Thus, the conductive layer 25 is constructed to be prevented from being rusted.

The first protective layer 26, which functions as a rustproof layer, may be formed of, for example, Ni, Cr, Ti, or an alloy of two or more metals selected from Ni, Cr and Ti according to exemplary aspects. The alloy may be, for example, stainless steel (SUS). The second protective layer 27, which functions as a rustproof layer, may also be formed of a material selected on the basis of the same criteria. The material of the second protective layer 27 may be the same as or different from the material of the first protective layer 26. The second protective layer 27 may have a structure in which a plurality of layers of different materials are stacked. According to an exemplary aspect, the thickness of the first protective layer 26 is preferably several hundred nanometers (nm) or more. Moreover, the thickness of the second protective layer 27 is preferably several hundred nanometers (nm) to several micrometers (μm).

The shield film 8 includes an adhesion layer 81 that is disposed between the conductive layer 25 and the first sealing resin 6a. According to an exemplary aspect, the thickness of the adhesion layer 81 may be, for example, about 50 nm. Moreover, the thickness of the conductive layer 25 may be, for example, 6 μm. The thickness of the first protective layer 26 may be, for example, 2 μm.

In the present embodiment, the type or the like of the module 101 can be identified by visually recognizing the recess 13. That is, the depth of the recess 13 is substantially equal to the thickness of the first protective layer 26, and the actual shape of the recess 13 may be determined by visual observation or imaging with a camera. In other words, the marked characters, symbols, graphics, and the like are readable based on the structure, configuration and/or depth of the recess 13.

The recess 13 is formed as a result of forming the marking section 12 by locally removing the first protective layer 26. Since the conductive layer 25 is disposed under the first protective layer 26, the marking section 12 may be formed without penetrating the conductive layer 25. Thus, the marking section may be formed without removing the first sealing resin 6a, and, as a result, a mark may be formed without removing the first sealing resin 6a. Therefore, the components sealed by the first sealing resin 6a will not be affected. According to the present embodiment, the module is constructed to prevent the components mounted thereon from being affected by the printing of a mark and to prevent the layout of the mark from being restricted by the arrangement of the components mounted thereon.

As illustrated in the present embodiment, a surface of the shield film 8 closer to the first sealing resin 6a is preferably formed with an adhesion layer 81. Thus, the shield film 8 may be more strongly adhered to the first sealing resin 6a.

The shield film 8 preferably covers the side surface of the first sealing resin 6a and the side surface of the substrate 1. Thus, the shielding may be performed more reliably.

In the present embodiment, the marking section 12 is formed, as described above, by locally removing the first protective layer 26 so as to form an opening and exposing the conductive layer 25 through the opening. However, it is noted that the marking section 12 is not limited thereto. The marking section 12 may be formed as a notch instead of an opening in the first protective layer 26. The marking section 12 may be any region on the conductive layer 25 without being covered by the first protective layer 26. Further, a region on the conductive layer 25 without being covered by the first protective layer 26 is not necessary. The marking section 12 may be formed as, for example, a recess on the upper surface of the first protective layer 26 without the necessity to penetrate the first protective layer 26.

Figure 3:
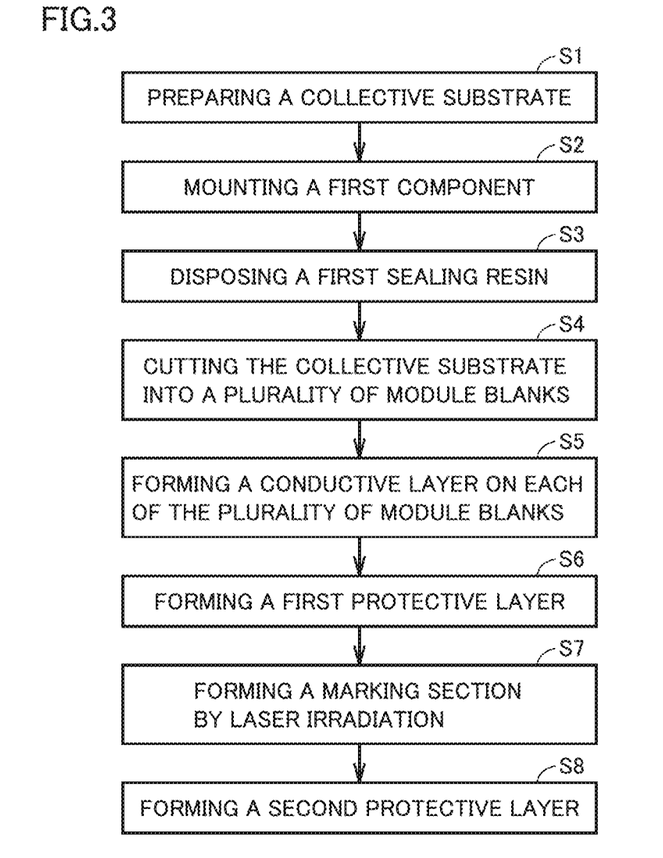
FIG. 3 is a flowchart illustrating a method of manufacturing a module according to the first exemplary embodiment.

FIG. 3 is a flowchart illustrating a method of manufacturing the module 101 according to the present embodiment.

As shown, the method of manufacturing a module according to the present embodiment includes a step S1 of preparing a collective substrate, a step S2 of mounting a first component on a first main surface of the collective substrate, a step S3 of disposing a first sealing resin so as to cover the first main surface and the first component, a step S4 of cutting the collective substrate into a plurality of module blanks, a step S5 of forming a conductive layer on each of the plurality of module blanks so as to cover the first sealing resin, a step S6 of forming a first protective layer so as to cover the conductive layer, a step S7 of forming a marking section by irradiating an upper surface of the first protective layer with a laser beam, and a step S8 of forming a second protective layer so as to cover the upper surface of the first protective layer and the marking section. Hereinafter, each step will be described in detail with reference to the drawings.

Figure 4:
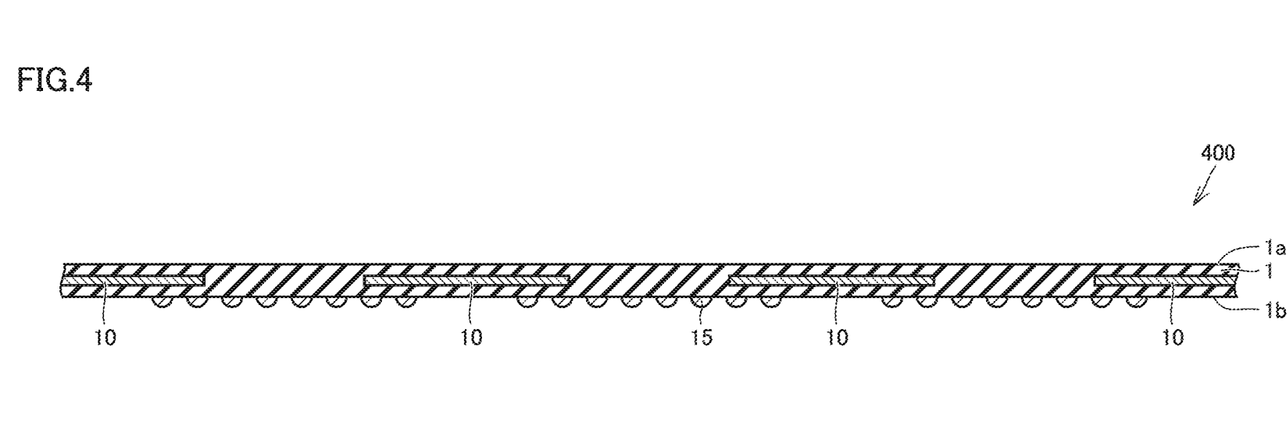
FIG. 4 is a first explanatory view illustrating the method of manufacturing a module according to the first exemplary embodiment.
Figure 5:
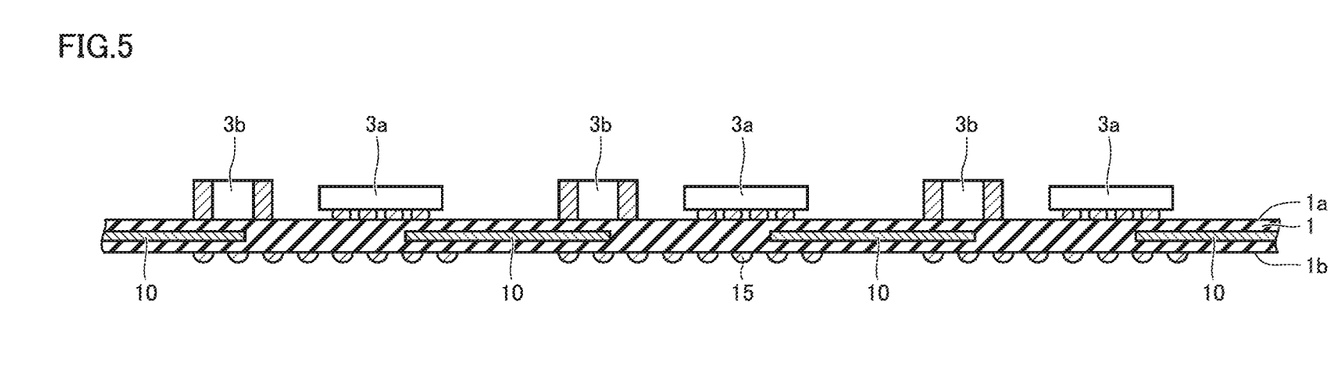
FIG. 5 is a second explanatory view illustrating the method of manufacturing a module according to the first exemplary embodiment.
Figure 6:
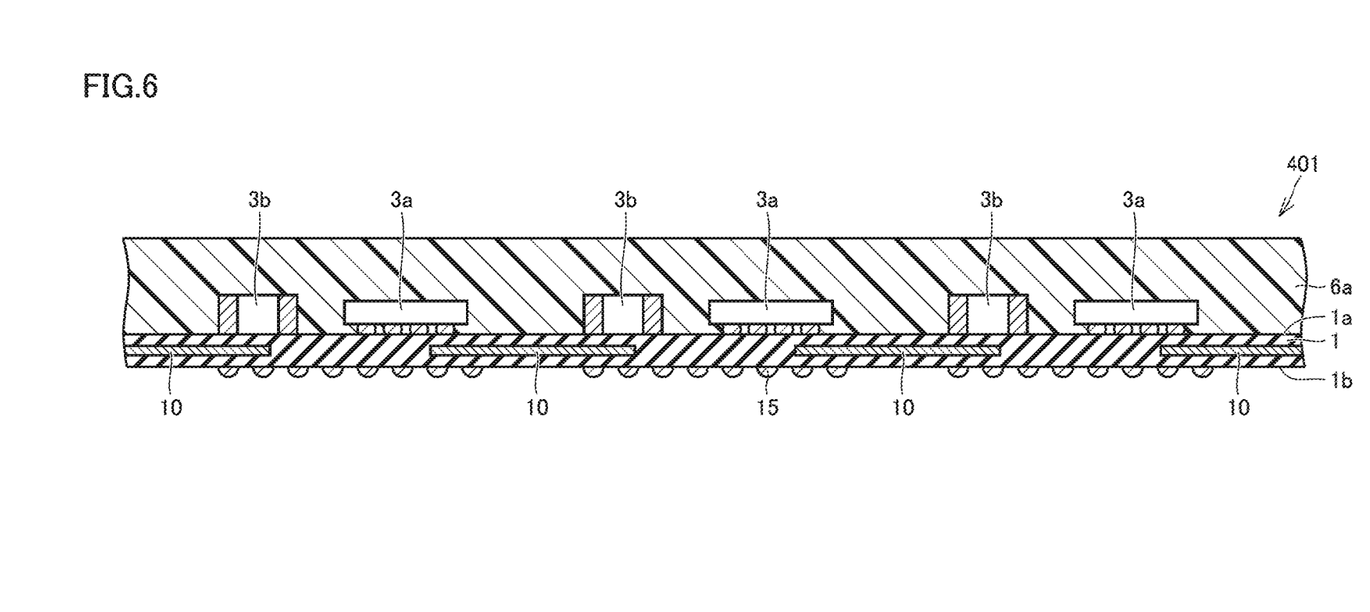
FIG. 6 is a third explanatory view illustrating the method of manufacturing a module according to the first exemplary embodiment.

First, in step S1, as illustrated in FIG. 4, a collective substrate 400 is prepared that includes a substrate 1. The substrate 1 has a first main surface 1a and a second main surface 1b. In step S2, as illustrated in FIG. 5, a first component 3a is mounted on the first main surface 1a of the collective substrate 400, and a component 3b can also be mounted on the first main surface 1a. In step S3, as illustrated in FIG. 6, a first sealing resin 6a is disposed so as to cover the first main surface 1a and the first component 3a. Thus, a collective substrate 401 is obtained in which the upper surface of the first sealing resin 6a is exposed.

Figure 7:
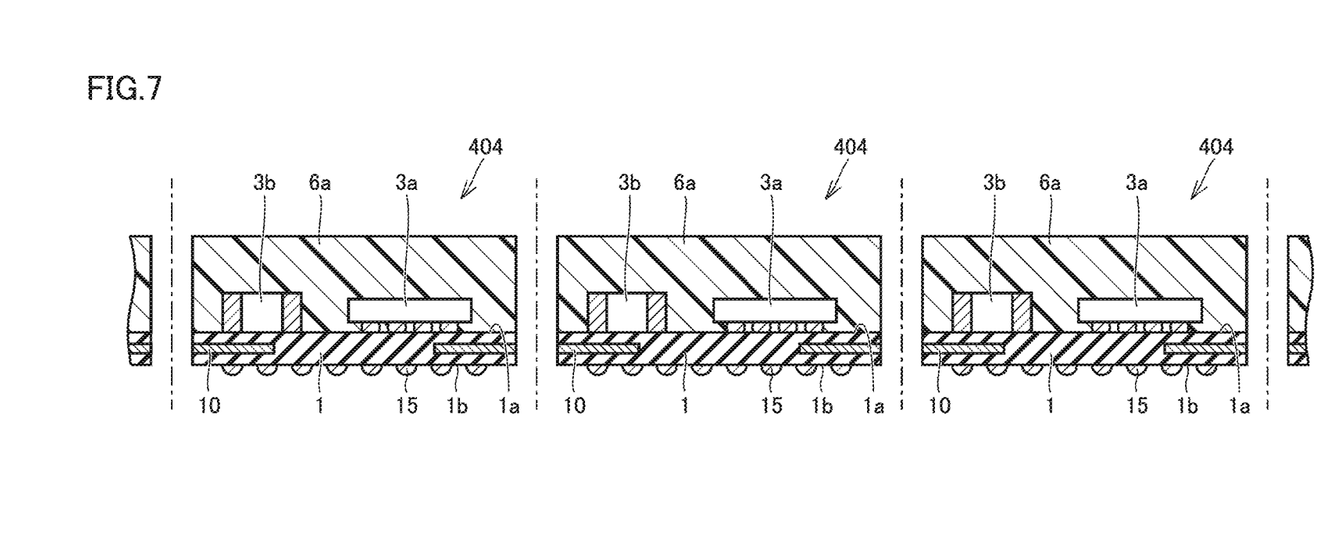
FIG. 7 is a fourth explanatory view illustrating the method of manufacturing a module according to the first exemplary embodiment.

In step S4, as illustrated in FIG. 7, the collective substrate 401 is cut into a plurality of module blanks 404.

Figure 8:
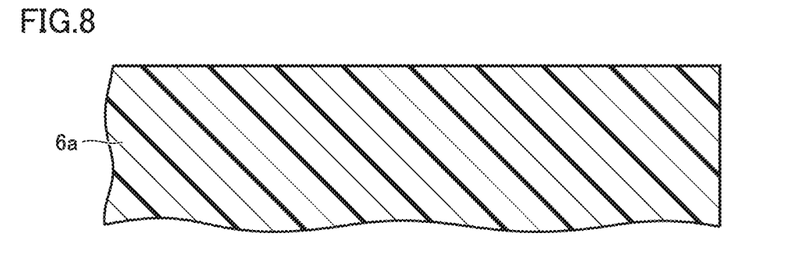
FIG. 8 is a fifth explanatory view illustrating the method of manufacturing a module according to the first exemplary embodiment.

FIG. 8 is a partially enlarged view illustrating a corner portion of the first sealing resin 6a after step S4 is performed. The corner portion illustrated in FIG. 8 corresponds to the portion Z1 in FIG. 1.

Figure 9:
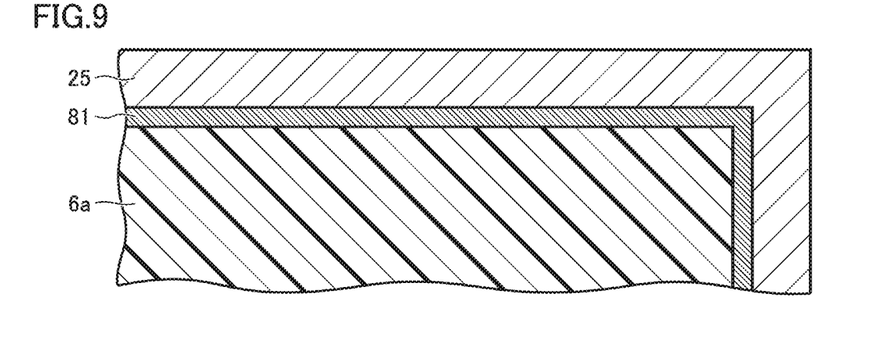
FIG. 9 is a sixth explanatory view illustrating the method of manufacturing a module according to the first exemplary embodiment.
Figure 10:
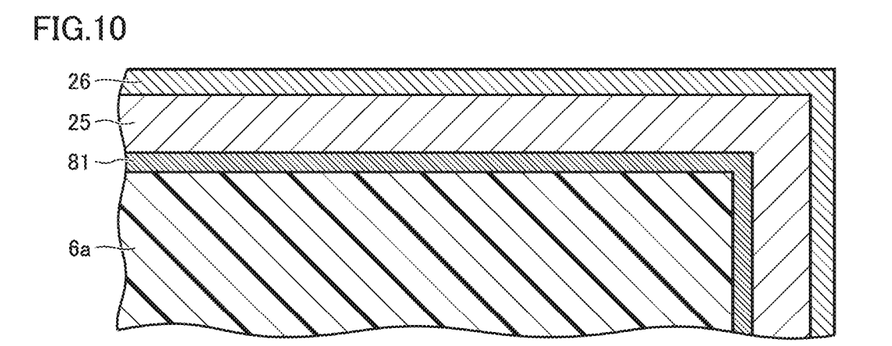
FIG. 10 is a seventh explanatory view illustrating the method of manufacturing a module according to the first exemplary embodiment.

In step S5, as illustrated in FIG. 9, a conductive layer 25 is formed on each of the plurality of module blanks 404. In other words, as illustrated in FIG. 9, an adhesion layer 81 is formed so as to cover the upper surface and the side surface of the first sealing resin 6a, and then a conductive layer 25 is formed so as to cover the adhesion layer 81. Thereafter, in step S6, as illustrated in FIG. 10, a first protective layer 26 is formed so as to cover the conductive layer 25.

Figure 11:
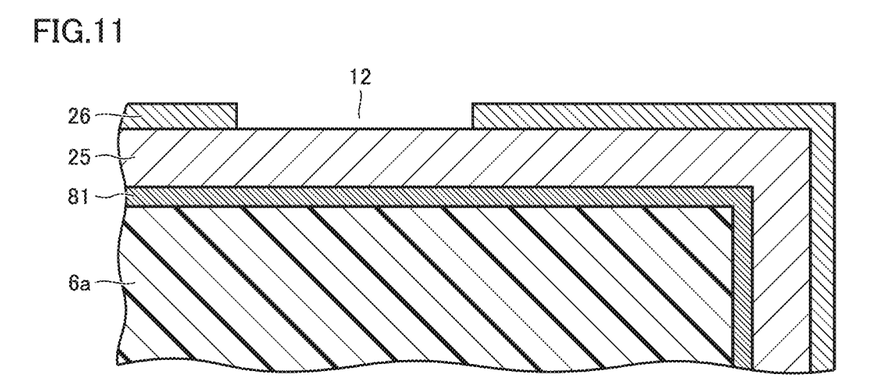
FIG. 11 is an eighth explanatory view illustrating the method of manufacturing a module according to the first exemplary embodiment.

In step S7, as illustrated in FIG. 11, a marking section 12 is formed. Specifically, in step S7, laser irradiation may be employed to form the marking section 12. The printing depth may be controlled by the difference in laser absorption coefficient between the conductive layer 25 and the first protective layer 26. For purposes of this disclosure, it is noted that the "printing depth" refers to the depth of a recess formed by laser irradiation. The printing depth is determined by the thickness of the first protective layer 26 and the irregularity of laser irradiation. The marking section 12 is formed by locally removing the first protective layer 26. The marking section 12 is a region without being covered by the first protective layer 26. The wavelength of the laser beam used for laser irradiation in step S4 is 532 nm or more when the material of the conductive layer 25 is Cu which has a low laser absorption coefficient, and it may be less than 532 nm.

Figure 12:
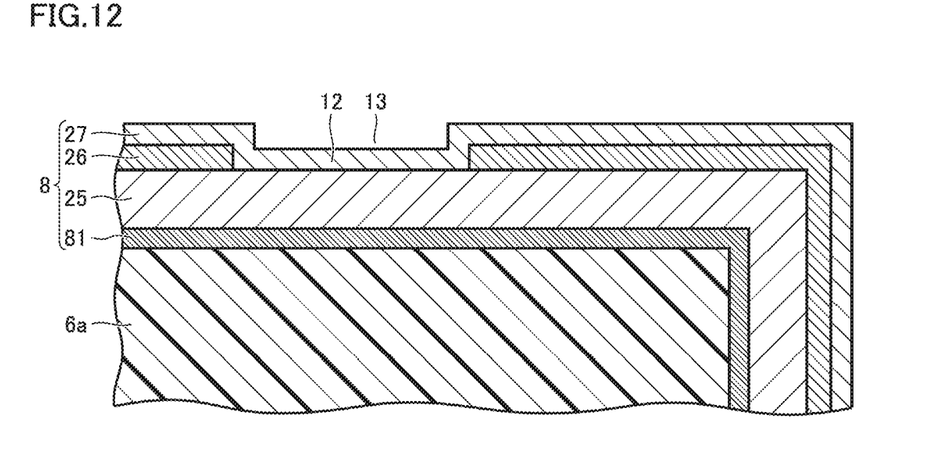
FIG. 12 is a ninth explanatory view illustrating the method of manufacturing a module according to the first exemplary embodiment.

In step S8, as illustrated in FIG. 12, a second protective layer 27 is formed, which can be done by any material deposition method (e.g., sputtering) or the like. Thus, a module as illustrated in FIG. 2 is obtained.

In an exemplary aspect, when the material of the conductive layer 25 is Cu and when laser irradiation is performed with a laser beam having a wavelength longer than the fundamental wavelength of YAG, Al may be used as the material of the first protective layer 26. When a laser beam having a wavelength longer than the fundamental wavelength of YAG is irradiated, Al is easier to be processed than Cu.

Moreover, when laser irradiation is performed with a laser beam having a wavelength shorter than the fundamental wavelength of YAG, Au or Ag may be used as the material of the first protective layer 26. When a laser beam having a wavelength shorter than the fundamental wavelength of YAG is irradiated, Au or Ag is easier to be processed than Al.

Second Exemplary Embodiment

Figure 13:
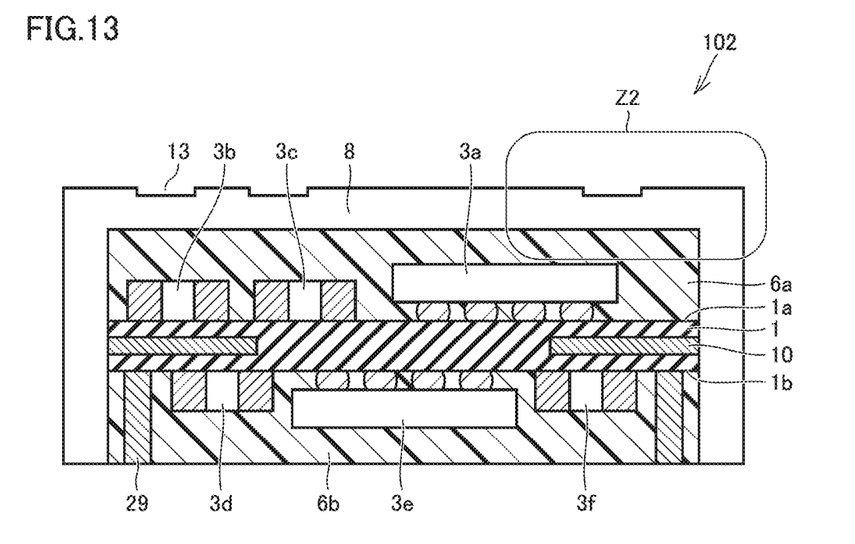
FIG. 13 is a cross-sectional view illustrating a module according to a second exemplary embodiment.

A module according to a second exemplary embodiment will be described with reference to FIG. 13. FIG. 13 is a cross-sectional view illustrating a module 102 according to the present embodiment.

As shown, the module 102 includes a substrate 1 having a first main surface 1a, a component 3a mounted on the first main surface 1a, a first sealing resin 6a disposed so as to cover the first main surface 1a and the component 3a, and a shield film 8 covering at least an upper surface of the first sealing resin 6a. The shield film 8 includes a conductive layer 25, a first protective layer 26 covering the conductive layer 25, and a second protective layer 27. The first protective layer 26 is locally formed with a marking section 12. The second protective layer 27 includes a first region 41 covering the first protective layer 26 and a second region 42 covering the marking section 12. The upper surface of the first region 41 is different from the upper surface of the second region 42 in height. An enlarged view of a portion Z2 in FIG. 13 is the same as that illustrated in FIG. 2.

In the example illustrated in the drawings, the first protective layer 26 is locally removed so as to expose the conductive layer 25 in the marking section 12. Moreover, the second protective layer 27 covers the conductive layer 25 exposed in the second region 42.

The substrate 1 has a second main surface 1b opposite to the first main surface 1a. A second component 3e is mounted on the second main surface 1b. A second sealing resin 6b is disposed so as to cover the second main surface 1b and the second component 3e. The shield film 8 covers the side surface of the second sealing resin 6b.

In addition to the first component 3a, components 3b and 3c can be mounted on the first main surface 1a. Similar to the first component 3a, the components 3b and 3c are also sealed by the first sealing resin 6a. In addition to the second component 3e, components 3d and 3f are mounted on the second main surface 1b. Similar to the second component 3e, the components 3d and 3f are also sealed by the second sealing resin 6b. A columnar conductor 29 is provided upright on the second main surface 1b. The columnar conductor 29 penetrates the second main surface 1b. The columnar conductor 29 is used as an external electrode of the module 104 after the module 104 is mounted on a mother substrate or the like. An external terminal 15 may be disposed at the lower end of the columnar conductor 29.

It is noted that in the exemplary second embodiment, the same effect and benefits as that described in the first embodiment may be obtained.

In general, it is noted that the exemplary embodiments described above may be appropriately combined. Moreover, the embodiments disclosed herein are illustrative and non-restrictive in all respects.

REFERENCE SIGNS LIST

1: substrate; 1a: first main surface; 1b: second main surface; 3a: first component; 3b, 3c, 3d, 3f: component; 3e: second component; 6a: first sealing resin; 6b: second sealing resin; 8: shield film; 10: GND electrode; 12: marking section; 13: recess; 15: external terminal; 25: conductive layer; 26: first protective layer; 27: second protective layer; 29: columnar conductor; 41: first region; 42: second region; 81: adhesion layer; 101, 102: module; 400, 401: collective substrate; 404: module blank

The invention claimed is:
1. A module comprising:
a substrate having a first main surface;
a first component mounted on the first main surface;
a first sealing resin disposed to cover the first main surface and the first component; and a shield film covering at least an upper surface of the first sealing resin and that includes a conductive layer, a first protective layer covering the conductive layer, and a second protective layer, wherein the first protective layer is constructed to include a marking section where a portion of the first protective layer is removed from covering the conductive layer, and the second protective layer includes a first region that covers the first protective layer and a second region that covers the marking section where the first protective layer is removed.

2. The module according to claim 1, wherein the second region of the second protective layer is disposed at a position that is lower than an upper surface of the first region of the second protective layer.

3. The module according to claim 2, wherein the position of the second region is lower than the upper surface of the first region in a direction relative to a thickness of the shield film.

4. The module according to claim 1, wherein the shield film comprises a surface that is closer to the first sealing resin and is constructed with an adhesion layer.

5. The module according to claim 1, wherein the first protective layer and the second protective layer are rustproof layers.

6. The module according to claim 1, wherein the shield film covers a side surface of the first sealing resin and a side surface of the substrate.

7. The module according to claim 1,
wherein the substrate has a second main surface opposite to the first main surface,
wherein a second component is mounted on the second main surface,
wherein a second sealing resin is disposed to cover the second main surface and the second component, and
wherein the shield film covers a side surface of the second sealing resin.

8. The module according to claim 1, wherein the second protective layer is formed of a same material as the first protective layer.

9. The module according to claim 1, wherein the second protective layer is formed of a different material than a material of the first protective layer.

10. The module according to claim 1, wherein the second protective layer comprises a structure of a plurality of stacked layers of different materials.

11. The module according to claim 1, wherein the marking section is defined by a recess in the first protective layer and the second region of the second protective layer extends into the recess.

12. The module according to claim 11, wherein the module is constructed to be visually identifiable based on a configuration and dimensions of the recess.

13. A module comprising:
a substrate having a main surface;
a component mounted on the main surface of the substrate;
a sealing resin disposed to cover the main surface and the component; and
a shield film covering at least an upper surface of the sealing resin and that includes a conductive layer, a first protective layer covering the conductive layer, and a second protective layer covering the first protective layer, wherein the first protective layer comprises a recess that exposes the conductive layer to define a marking section, and the second protective layer includes a first region that covers the first protective layer and a second region that covers the recess.

14. The module according to claim 13, wherein the second region of the second protective layer is disposed at a position that is lower than an upper surface of the first region of the second protective layer.

15. The module according to claim 14, wherein the position of the second region is lower than the upper surface of the first region in a direction relative to a thickness of the shield film.

16. A method of manufacturing a module, the method comprising:
preparing a collective substrate;
mounting a plurality of components on a main surface of the collective substrate;
disposing a sealing resin to cover the main surface and the plurality of components;
cutting the collective substrate into a plurality of module blanks;
forming a conductive layer on each of the plurality of module blanks to cover the sealing resin;
forming a first protective layer on each of the plurality of module blanks to cover the conductive layer;
forming a marking section by irradiating an upper surface of the first protective layer with a laser beam; and
forming a second protective layer to cover the upper surface of the first protective layer and the marking section.

17. The method of manufacturing a module according to claim 16, wherein the forming of the second protective layer comprises forming a second region over the marking section that is disposed at a position that is lower than an upper surface of a first region of the second protective layer that is not over the marking section.

18. The method of manufacturing a module according to claim 17, wherein the position of the second region is lower than the upper surface of the first region in a direction relative to a thickness of the conductive layer, the first protective and the second protective.

19. The method of manufacturing a module according to claim 16, wherein the forming of the marking section comprises defining a recess by the laser beam in the first protective layer and forming the second protective layer to extend into the recess.

20. The method of manufacturing a module according to claim 19, further comprising constructing the module to be visually identifiable based on a configuration and dimensions of the recess.

* * * * *